US006996319B2

(12) United States Patent
Noda et al.

(10) Patent No.: US 6,996,319 B2
(45) Date of Patent: Feb. 7, 2006

(54) TWO-DIMENSIONAL PHOTONIC CRYSTAL OPTICAL RESONATOR AND OPTICAL REFLECTOR USING INTERFERENCE BETWEEN POINT DEFECTS

(75) Inventors: Susumu Noda, Uji (JP); Takashi Asano, Kyoto (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/508,145

(22) PCT Filed: Mar. 26, 2003

(86) PCT No.: PCT/JP03/03763

§ 371 (c)(1),
(2), (4) Date: Sep. 17, 2004

(87) PCT Pub. No.: WO03/081305

PCT Pub. Date: Feb. 10, 2003

(65) Prior Publication Data

US 2005/0147371 A1  Jul. 7, 2005

(30) Foreign Application Priority Data

Mar. 26, 2002  (JP)  ............... 2002-086222

(51) Int. Cl.
*G02B 6/10*  (2006.01)
(52) U.S. Cl. .................................. 385/129
(58) Field of Classification Search ......... 385/129–132
See application file for complete search history.

(56) References Cited

U.S. PATENT DOCUMENTS

| | | | | |
|---|---|---|---|---|
| 6,101,300 A | * | 8/2000 | Fan et al. | 385/27 |
| 6,687,447 B2 | * | 2/2004 | Flory et al. | 385/129 |
| 6,738,551 B2 | * | 5/2004 | Noda et al. | 385/130 |
| 2002/0009277 A1 | | 1/2002 | Noda et al. | |

FOREIGN PATENT DOCUMENTS

| | | |
|---|---|---|
| JP | A 2001-272555 | 10/2001 |
| WO | WO 98/57207 | 12/1998 |

* cited by examiner

*Primary Examiner*—Sarah N Song
(74) *Attorney, Agent, or Firm*—Oliff & Berridge, PLC

(57) ABSTRACT

The present invention provides a two-dimensional photonic crystal optical resonator and reflector having high light-extracting efficiency. A two-dimensional photonic crystal consisting of a slab-shaped body is created by periodically arranging holes having a refractive index different from that of the body. A waveguide is formed by providing a linear zone where no hole is bored. Two acceptor type point defects are formed by enlarging two holes spaced apart from each other by a distance L in the longitudinal direction of the waveguide. An appropriate selection of the distance L suppresses or increases the reflection and transmission of light at the point defects, allowing an efficient extraction of light resonating at the point defects. This allows the body to be used as an optical resonator for producing a resonance of light between the two point defects or optical reflector for reflecting light at the two point defects.

17 Claims, 5 Drawing Sheets

PRIOR ART

TWO-DIMENSIONAL PHOTONIC CRYSTAL OPTICAL RESONATOR AND OPTICAL REFLECTOR USING INTERFERENCE BETWEEN POINT DEFECTS

TECHNICAL FIELD

The present invention relates to an optical resonator and an optical reflector that can be used, for example, as a light source for wavelength division multiplexing communication.

BACKGROUND ART

Recently, photonic crystals have been drawing attentions as a new optical device. A photonic crystal is an optical functional material having a periodic distribution of refractive index, which provides a band structure with respect to the energy of photons. One of its particular features is that it has an energy region (called the photonic bandgap) that does not allow the propagation of light.

An example of the application fields of the photonic crystal is the optical communication. Recent optical communications use the wavelength division multiplexing (WDM) in place of a conventional method called the time division multiplexing (TDM). Wavelength division multiplexing is a communication method in which plural wavelengths of light, each carrying a different signal, propagate through a single transmission line. This method has drastically increased the amount of information that can be transmitted per unit of time.

Wavelength division multiplexing needs a light source for each of the plural wavelengths. Among the light sources currently used, one type uses semiconductor lasers each having a different oscillation wavelength corresponding to each wavelength, and another type uses a white light source combined with an optical demultiplexer. These methods, however, inevitably increase the size of the device, and are inefficient.

It has been already known that photonic crystals can be used as optical resonators. Since an optical resonator is capable of confining light, an appropriate means for extracting light enables it to be used as a light source. Use of a photonic crystal as a light source will significantly reduce the size of the wavelength division multiplexing optical communication devices.

A study has been conducted on the use of photonic crystals, specifically two-dimensional photonic crystals, as optical resonators (as described in the Japanese Unexamined Patent Publication No. 2001-272555, for example). According to the document, a point defect and a line defect that create a disorder in the periodicity of the photonic crystal are introduced to create an energy level (defect level) caused by the defect within the photonic bandgap. This allows the light to exist only at wavelengths corresponding to the energy of the defect level within the wavelength range corresponding to the photonic bandgap. The line defect functions as a waveguide, and the point defect functions as an optical resonator. When a ray of light having a specific resonance wavelength included in the white light is introduced through the waveguide into the optical resonator, the light resonates at the optical resonator and is emitted from the two-dimensional surface to the outside. Thus, the two-dimensional photonic crystal can be used as a light source emitting the specific wavelength of light. The application of the two-dimensional photonic crystal is not limited to the optical resonator (or light source); its application to wavelength multiplexing/demultiplexing devices is also considered.

For the above-described conventional two-dimensional photonic crystal, it is assumed that the optical resonator uses only a single point defect for each wavelength. However, such a simple structure including only a single point defect allows a portion of the light passing through the waveguide to be reflected at around the waveguide and the optical resonator or pass through the waveguide without entering the optical resonator (i.e. be transmitted through the optical resonator). The light reflected thereby is called the "reflected light" and the light transmitted thereby is called the "transmitted light" hereinafter. The presence of the reflected light and the transmitted light deteriorates the light-extracting efficiency of the optical resonator. Practically, the light-extracting ratio, which is defined as the ratio of the amount of light emitted from the optical resonator to the outside to the amount of the component of light having the resonance wavelength within the white light introduced into the waveguide, could not be higher than approximately 50%.

The present invention has been devised to solve such a problem, and one of its objects is to provide a two-dimensional photonic crystal optical resonator having high light-extracting efficiency. The present invention also intends to demonstrate that the same structure can be applied to optical reflectors.

DISCLOSURE OF THE INVENTION

To solve the aforementioned problem, the first mode of the two-dimensional photonic crystal optical resonator using interference between point defects of the present invention includes:

a) a slab-shaped body;

b) a plurality of modified refractive index areas having a refractive index different from that of the body, which are periodically arranged in the body;

c) a waveguide formed in the body by defects of the modified refractive index areas linearly; and d) a point-like defect pair consisting of two point-like defects of the same type, which are located in proximity to the waveguide and spaced apart from each other in the longitudinal direction of the waveguide by a distance $(2n-1)/4$ times as long as the resonance wavelength of interest, where n is a positive integer.

The second mode of the two-dimensional photonic crystal optical resonator using interference between point defects of the present invention includes:

a) a slab-shaped body;

b) a plurality of modified refractive index areas having a refractive index different from that of the body, which are periodically arranged in the body;

c) a waveguide formed in the body by making defects of the modified refractive index areas linearly; and d) a point-like defect pair consisting of two point-like defects of the same type, which are located in proximity to the waveguide and spaced apart from each other in the longitudinal direction of the waveguide by a distance $n/2$ times as long as a resonance wavelength of interest, where n is a positive integer.

The two-dimensional photonic crystal optical reflector using interference between point defects includes:

a) a slab-shaped body;

b) a plurality of modified refractive index areas having a refractive index different from that of the body, which are periodically arranged in the body;

c) a waveguide formed in the body by making defects of the modified refractive index areas linearly; and d) a point-like defect pair consisting of two point-like defects of the same type, which are located in proximity to the waveguide and spaced apart from each other in the longitudinal direction of the waveguide by a distance m/2 times as long as the resonance wavelength of interest, where m is a positive integer.

It is also possible to use the above-mentioned optical reflector to construct each of the point-like defects constituting the point-like defect pair in the second mode of the optical resonator.

According to the present invention, a plate-shaped slab with its thickness adequately smaller than its size in the in-plane direction is used as the body of the two-dimensional photonic crystal optical resonator using interference between point defects. In this body, modified refractive index areas having a refractive index different from that of the body are periodically arranged. The presence of the periodical arrangement of the modified refractive index areas generates a photonic bandgap, which does not allow the presence of light whose energy falls within the range of the photonic bandgap. This means that the light having a wavelength corresponding to that energy cannot pass through the body.

The refractive index of the modified refractive index area may be higher or lower than that of the body. From the viewpoint of easier material selection, however, it is recommendable to make the modified refractive index area from a material having a low refractive index, because the body is usually made from a material having a high refractive index.

The low refractive index area may be created by embedding a material having a low refractive index in the body or just forming a hole in the body. In the latter case, the air constitutes the modified refractive index area. Practically, air is the material that has the lowest refractive index. Therefore, forming a hole is advantageous to increase the difference in the refractive index between the modified refractive index area and the body. This provides a high level of Q-factor as a resonator or reflector. Furthermore, forming a hole is easier than embedding a different material.

In the following description, the points at which the modified refractive index areas are periodically arranged are called the lattice points. The lattice points can be arranged in various patterns. Typical examples include the square lattice pattern or the triangular lattice pattern.

In a photonic crystal having a periodicity as described above, a defect formed at the modified refractive index area located at a certain lattice point creates a disorder in the periodicity. If the parameters of the defect are appropriately determined, the disorder in periodicity creates a defect level within the photonic bandgap, which generates a point that allows the presence of light within the body in which light is not basically allowed to exist. This is called the point defect. Creating point defects along a line forms a waveguide within the body, which light can pass through. This is called the line defect. A line defect may take the form of a bent or curved line as well as a straight line. A line defect may be composed of a single row of lattice points or plural rows of lattice points lying side by side.

In the case of forming the modified refractive index areas from the holes, the easiest method of creating a defect at a lattice point is to fill the hole at the lattice point with the material of the body, that is, to omit boring a hole at the lattice point. Alternatively, increasing the diameter of a hole makes the hole a defect. A defect created by not boring a hole at a lattice point is called the donor type defect, and a defect created by increasing the diameter of the hole is called the acceptor type defect.

The donor type defect and the acceptor type defect are described. This specification refers to the refractive index because the present invention concerns light including infrared and ultraviolet rays. In general, however, a photonic crystal is created by a periodic difference in the dielectric constant. Therefore, to create a defect, the dielectric constant of one of the modified refractive index areas (or lattice points) periodically arranged in the body should be changed. A lattice point whose dielectric constant is higher than that of the others is called the donor type defect, and that with lower dielectric constant is called the acceptor type defect. When, as described before, holes are arranged in a body made from a certain material and no hole is bored (or the hole is filled with the body material) at a certain lattice point to create a defect, the dielectric constant at the point is higher than that of air, so that the point becomes a donor type defect. In contrast, increasing the diameter of the hole at a lattice point will decrease the dielectric constant at that point, and the point will be an acceptor type defect.

According to the present invention, two point-like defects having the same shape and size are arranged in proximity to the waveguide and spaced from each other in the guiding direction of the waveguide by a distance L. The structure constituted by the two point-like defects is called the point-like defect pair. The "proximity to the waveguide" hereby means the zone where the two point-like defects have some significant interaction with the waveguide. Though, from the viewpoint of symmetry, the distances of the two point-like defects from the waveguide should be the same, it is allowable that they are slightly different. The point-like defects include the point defect consisting of a single lattice point and the cluster defect consisting of plural point defects adjacent to each other. The point-like defect may be either the acceptor type defect or the donor type defect.

The size and shape of each point-like defect (and, in the case of a cluster defect, the arrangement of the point defects constituting it) are determined so that the resonance wavelength at which the resonator constituted by the two point-like defects (and the waveguide located in its proximity) should resonate is equal to the objective resonance wavelength.

The structures described so far are basically common to both first and second modes of the optical resonator according to the present invention. The reason why the word "basically" is used here is that, in the second mode, each point-like defect may be replaced with two point-like defects (or a point-like defect pair) spaced apart from each other by a distance L' (L>L'), as described later.

In the first mode, the distance L between the two point-like defects is (2n−1)/4 times as large as the objective resonance wavelength λ, where n is a positive integer. Namely, it is equal to a quarter of the objective resonance wavelength multiplied by an odd integer. In other words, the distance is equal to the value obtained by adding or subtracting a quarter of the wavelength to or from the objective wavelength multiplied by an integer. The wavelength λ hereby is the wavelength of light propagating through the body, which depends on the refractive index of the body.

The reason for setting $\lambda=(2n-1)/4$ is as follows. For the convenience of explanation, the point-like defect first encountered by the light propagating through the waveguide is called "defect 1", and the other point-like defect is called "defect 2." When the distance L is determined in this way, the optical path difference between the light reflected at defect 1 and the light reflected at defect 2 is 2L=(2n−1)λ/2, i.e. the half-wavelength multiplied by an odd-number, so that the two rays of reflected light interfere and cancel each other. Thus, both reflected light and transmitted light are suppressed, and the light existing within the waveguide efficiently flows into the resonator and is trapped thereby.

The distance between each point-like defect and the waveguide does not affect the optical path difference. To suppress the reflected light and the transmitted light, what is necessary is to design the distance between the point-like defect and the waveguide so that $Q_p$, which indicates the Q-factor between the waveguide and each point-like defect, and $Q_v$, which indicates the Q-factor between each defect and the outside, are close to, or preferably equal to, each other.

In the second mode, the distance L between the two point-like defects is n/2 times as long as the objective resonance wavelength λ, where n is a positive integer. Namely, the distance L is equal to a half of the objective resonance wavelength multiplied by an integer. When the distance L is determined in this way, the rays of light reflected at defect 1 and defect 2 form a standing wave between the two defects and resonate. Namely, in the second mode, the waveguide located between the two point-like defects functions as a resonator. This mode of resonator is called the waveguide optical resonator hereinafter.

In this waveguide optical resonator, resonant light can be extracted either from the waveguide or in the direction perpendicular to the two-dimensional surface. The way of extracting light can be chosen from these two options according to the purpose and conditions of use.

The waveguide optical resonator may be constructed as a laser light source by containing a laser medium in the waveguide.

In the second mode, the point-like defect is used to reflect light. A point-like defect reflects only a specific wavelength of light corresponding to the defect level. Therefore, this resonator allows only a single wavelength of light to resonate without being influenced by a higher harmonic wave. To intensify the reflection at the point-like defects, it is desirable in the second mode to make $Q_v$ adequately greater than $Q_p$.

As described above, the optical resonator according to the second mode can be used as an optical reflector. When attention is paid to the entrance side of the traveling path of the progressive wave in the waveguide, the optical path difference 2L between the reflected light from defect 1 and that from defect 2 is equal to the wavelength multiplied by an integer, so that the two rays of reflected light intensify each other. This means that the light is efficiently reflected on the entrance side of the waveguide. This allows the optical resonator to be used as an optical filter that reflects a specific wavelength of light and does not allow it to pass through.

In the above-described optical reflector, another set of two point-like defects (or point-like defect pair) may be added to the opposite side of the waveguide. In this case, the distances in the width-direction of the waveguide may be slightly different, whereas the longitudinal position must be the same. In this case, the four point-like defects as a set constitute an optical reflector. This structure provides a higher efficiency of reflecting light than the optical reflector using two point-like defects as a set.

Use of the above-described optical reflector will strengthen the resonance occurring within the optical resonator of the second mode. In the second mode, the above-described set of two or four point-like defects are arranged at the locations of the defect 1 and defect 2, respectively. The set of two or four point-like defects reflects light more efficiently than a single point-like defect, so that the resonance occurring within the optical resonator of the second mode is strengthened and the light-extracting efficiency is improved.

In the first mode of two-dimensional photonic crystal optical resonator using interference between point defects according to the present invention, the reflected light and the transmitted light, which cause the deterioration in the light-extracting efficiency of conventional types of two-dimensional photonic crystal optical resonator using point defect, are suppressed. This leads to an increased intensity of light emitted from the point-like defect to the outside and improves the light-extracting efficiency.

In the second mode of the two-dimensional photonic crystal optical resonator using interference between point defects according to the present invention, the light reflected at the point-like defects is positively used to produce a resonance of light within the waveguide between the two point-like defects. This is a new type of optical resonator, which is different from conventional two-dimensional photonic crystal optical resonators in which the point-like defects themselves function as optical resonators.

Furthermore, the structure of the two-dimensional photonic crystal optical resonator using interference between point defects according to the second mode of the present invention can be used as an optical reflector. This enables the construction of a filter that blocks a specific wavelength of light included in the light propagated from one end and reflects the light.

BRIEF DESCRIPTION OF THE DRAWINGS

FIGS. 8(*a*), 8(*b*) and 8(*c*) schematically show other examples of the structure of the two-dimensional photonic crystal waveguide optical resonator using interference between point defects.

Figure 1:
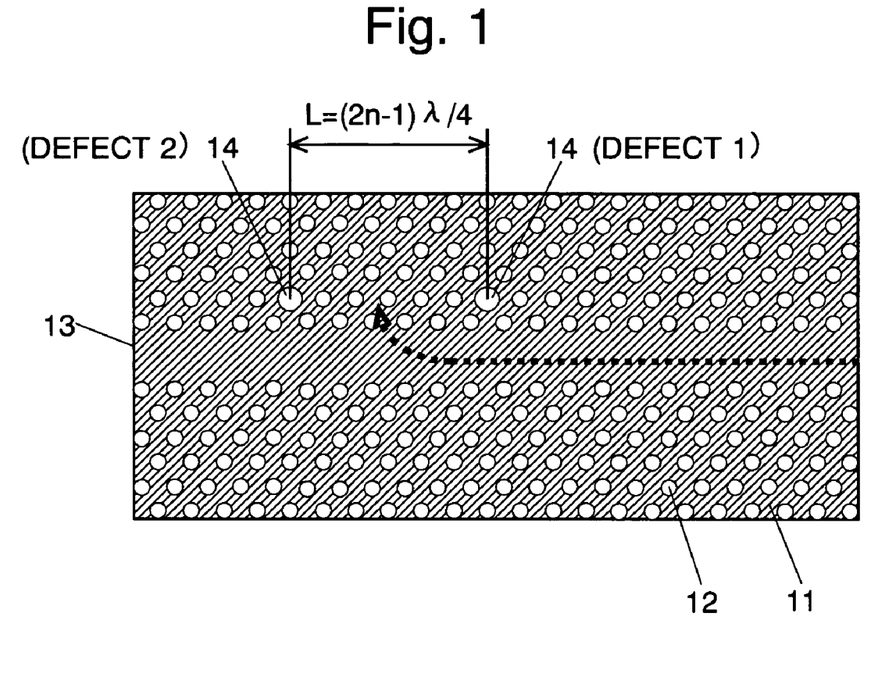
FIG. 1 shows an example of the two-dimensional photonic crystal optical resonator using interference between point defects according to the present invention, in which acceptor type point defects are used as the point-like defects.
Figure 2:
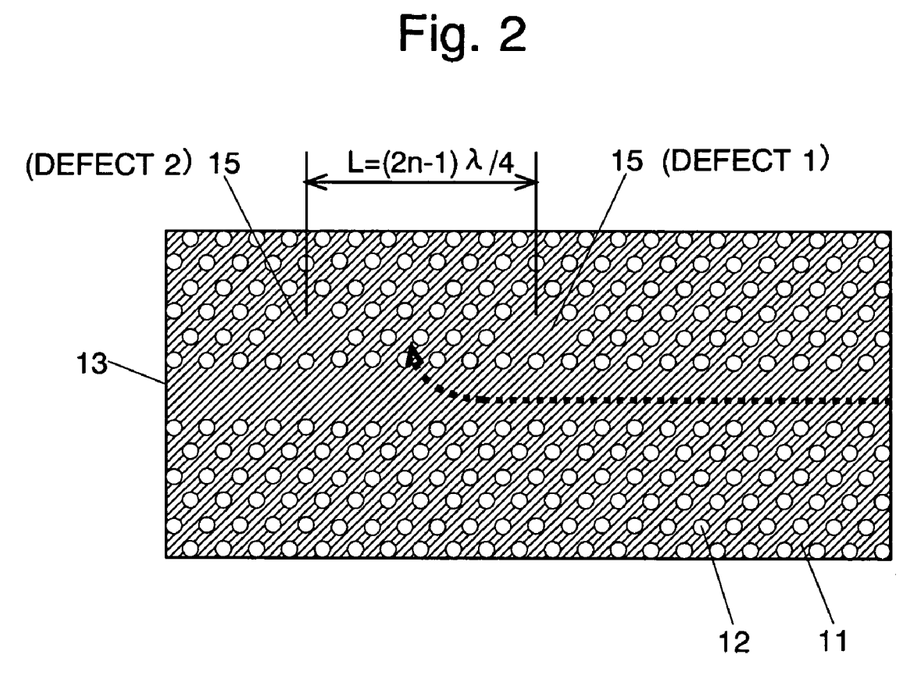
FIG. 2 shows an example of the two-dimensional photonic crystal optical resonator using interference between point defects according to the present invention, in which donor type cluster defects are used as the point-like defects.

BEST MODE FOR CARRYING OUT THE INVENTION (1) Example of Structure According to First Mode FIGS. 1 and 2 show an example of the structure of the two-dimensional photonic crystal optical resonator using interference between point defects according to the present invention. The plate-shaped object shown in FIGS. 1 and 2 is the slab (body) 11. When the infrared light of 1.5 μm waveband used in optical communications is considered, the slab 11 may be made from InGaAsP, which is transparent to that waveband.

On this slab 11, holes 12 are arranged at cycle a. These holes 12 are the modified refractive index areas, whereby a photonic bandgap is formed. FIGS. 1 and 2 show an example in which holes 12 are arranged in a triangular lattice pattern. It is possible to use other periodical arrangement patterns, such as a square lattice pattern.

The aforementioned Japanese Unexamined Patent Publication No. 2001-272555 teaches that the aforementioned waveband corresponds to the frequency range from $0.27c/a$ to $0.28c/a$, where c is the speed of light, or the wavelength range from $a/0.28$ to $a/0.27$. Therefore, to create a defect level corresponding to the wavelength $\lambda$ within a photonic bandgap to produce a resonance of light having the wavelength $\lambda$, what is necessary is to select the cycle a from the range from $0.27\lambda$ to $0.28\lambda$. For the infrared light of 1.5 μm wavelength, for example, the cycle a is about 0.41 to 0.42 μm.

The waveguide 13 is formed by providing a linear zone where no hole is bored.

In the example shown in FIG. 1, two acceptor type point defects 14 having the same shape and size are spaced apart from each other by a distance $L=(2n-1)/4$ in the longitudinal direction of the waveguide. The acceptor type point defect 14 is formed by increasing the radius of the hole 12. In the example shown in FIG. 2, two donor type cluster defects 15 having the same shape are spaced apart from each other by a distance $L=(2n-1)/4$ in the longitudinal direction of the waveguide. The donor type cluster defects 15 is formed by not boring two or more holes 12 located adjacent to each other. In the example shown in FIG. 2, the donor type cluster defect is shaped triangular. It may otherwise take various forms, such that is shaped linear or consists of four or more defects.

(2) Light-Extracting Efficiency in First Mode

The result of a study on the light-extracting efficiency in the case of using the acceptor type point defect shown in FIG. 1 is described below. In the first step, the cycle a of the lattice points and the aforementioned distance L are determined. When the holes are arranged as shown in FIG. 1, each of the two acceptor type point defects is located at a lattice point, so that L is equal to the cycle a multiplied by an integer, i.e. $L=ma$, where m is an integer. From this equation and the aforementioned condition $L=(2n-1)\lambda/4$, the equation $a=\lambda(2n-1)/4m$ is obtained. Then, under the condition $0.27\lambda<a<0.28\lambda$ for creating a defect level corresponding to the wavelength $\lambda$ within the aforementioned photonic bandgap, a and L can be determined by appropriately selecting integers for m and n.

Figure 3:
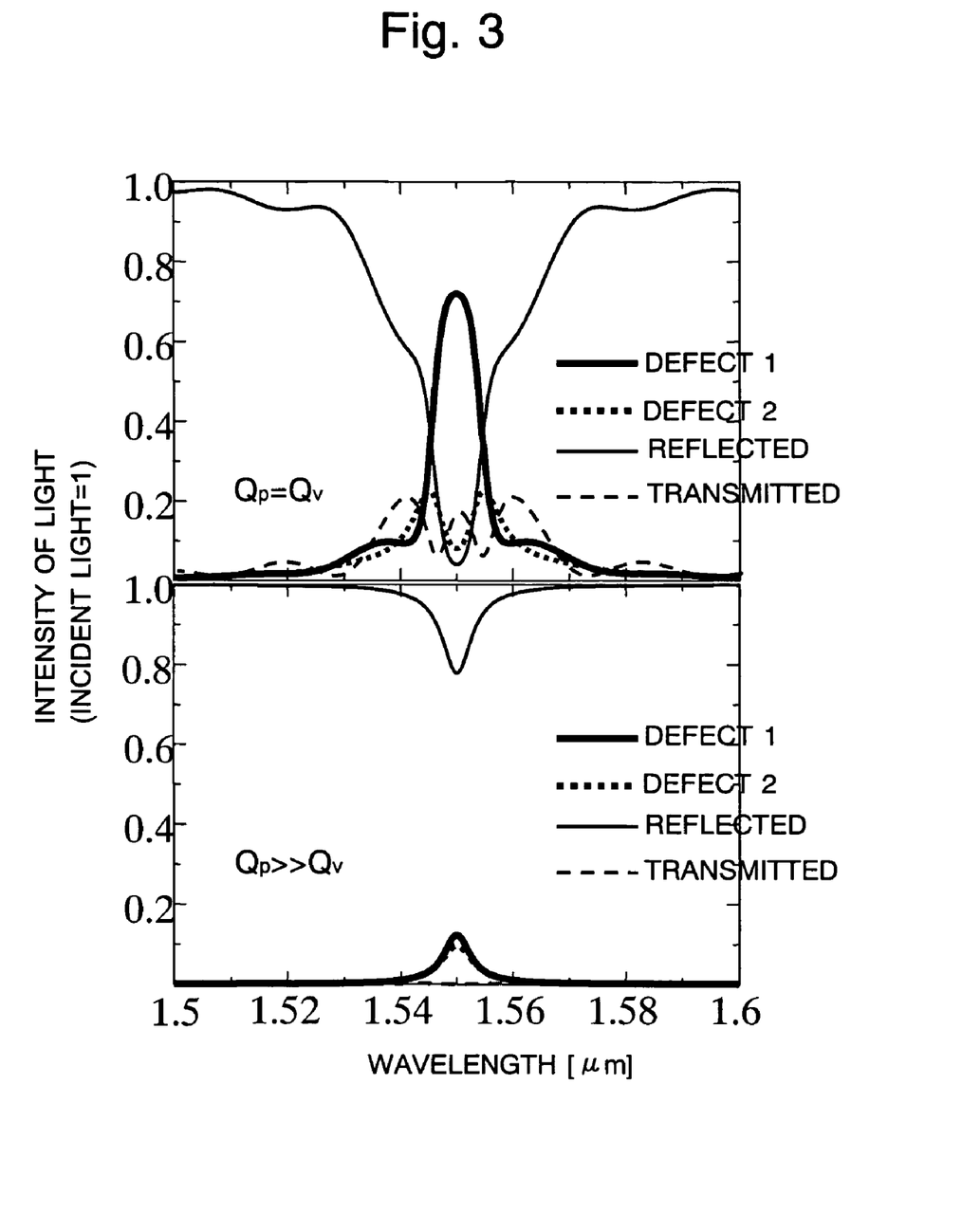
FIG. 3 shows the light output efficiency of a two-dimensional photonic crystal optical resonator using interference between point defects according to the first mode of the resonator.

In the present example, the light-extracting efficiency has been calculated with $a=0.410$ μm and $L=16.0$ μm (n=26, m=39); this setting satisfies the above-described conditions when $\lambda=1.255$ μm, which is equivalent to wavelength $\lambda=1.5$ μm in the air. On the assumption that the intensity of the above-specified wavelength of light coming from the waveguide is 1, the intensity of the light emitted from defect 1, the intensity of the light emitted from defect 2, the intensity of the light reflected by defect 1 and defect 2, and the intensity of the light transmitted through defect 1 and defect 2, were calculated. The calculations were carried out for $Q_p=Q_v$ and $Q_p<Q_v$, respectively, where $Q_p$ is the Q-factor between the waveguide and each defect, and $Q_v$ is the Q-value between each defect and the outside. The result is shown in FIG. 3. It shows that, when $Q_p=Q_v$, approximately 70% of the introduced light is emitted (or extracted) from the defect 1 to the outside at $\lambda=1.5$ μm.

Figure 4:
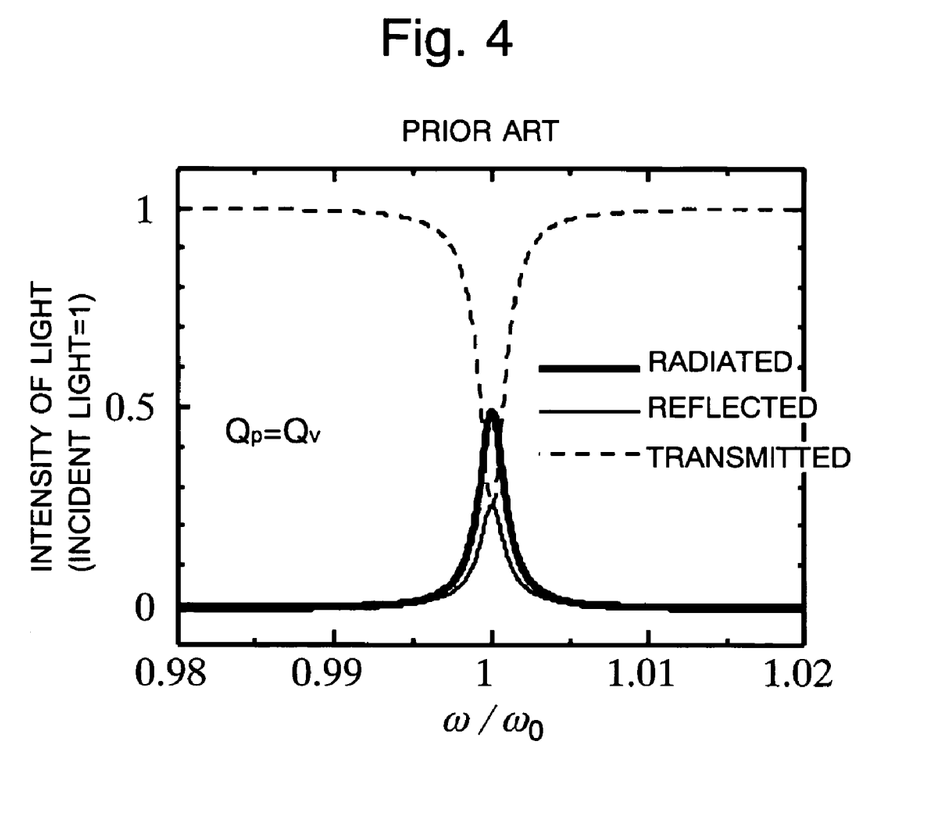
FIG. 4 shows the light output efficiency of a conventional type of two-dimensional photonic crystal optical resonator using interference between point defects.

By comparison, FIG. 4 shows the light output efficiency of a conventional type of two-dimensional photonic crystal optical resonator. In FIG. 4, the abscissa indicates the angular frequency ω of light divided by the central angular frequency $\omega_0$. This figure shows that, in the conventional case, the maximum light output efficiency is about 50%. Comparing this value with the aforementioned percentage shows that the resonator according to the present invention is improved in light output efficiency.

Figure 5:
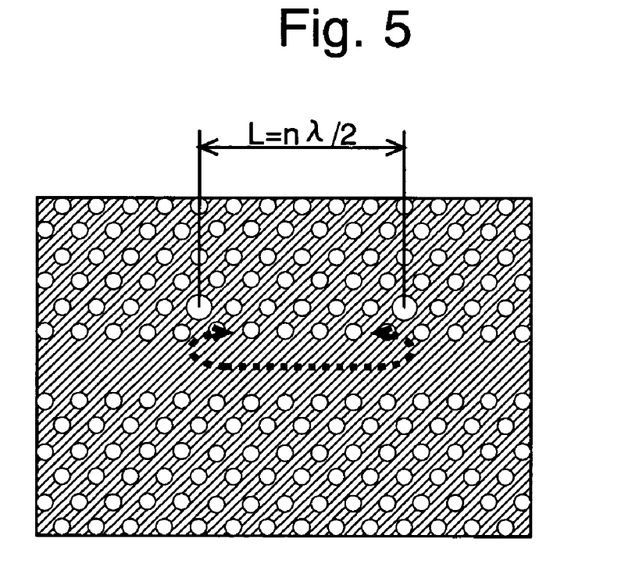
FIG. 5 schematically shows an example of the structure of the two-dimensional photonic crystal waveguide optical resonator using interference between point defects.

(3) Embodiment of Two-Dimensional Photonic Crystal Waveguide Optical Resonator Using Interference between Point Defects FIG. 5 shows an example of the structure of the waveguide optical resonator according to the second mode of the present invention. In this example, two point-like defects are located on one side of the waveguide and spaced apart from each other by a distance $L=n\lambda/2$ in the direction parallel to the waveguide. As indicated by the thick arrow, the light in the waveguide is reflected by the two point-like defects and confined within the waveguide between them. To improve such a confining effect, it is desirable to make $Q_v$, or the Q-factor at each point-like defect for the outward direction, as large as possible and $Q_p$, or the Q-factor in the direction parallel to the waveguide, as small as possible. The following section investigates the conditions.

Figure 7:
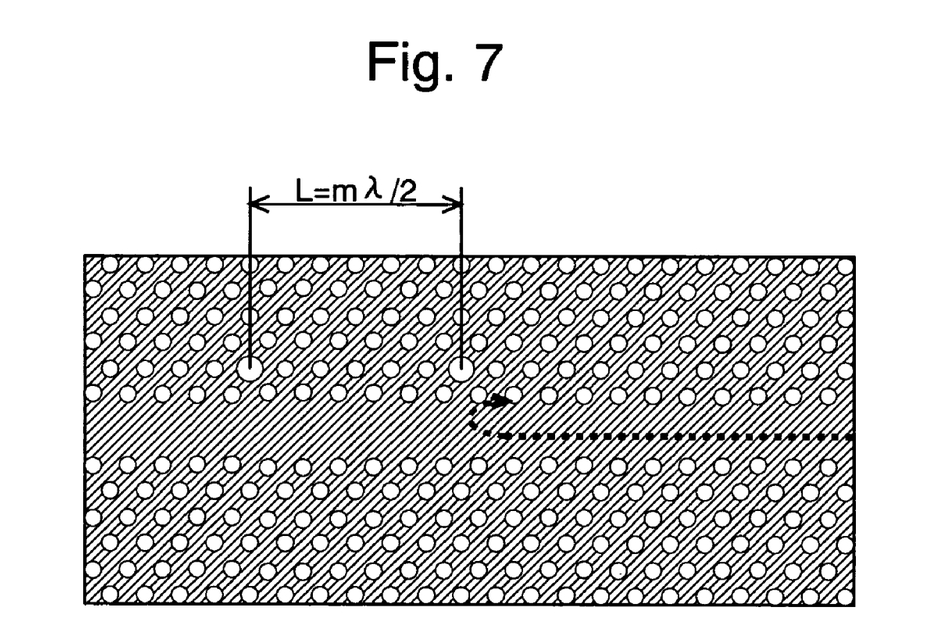
FIG. 7 schematically shows an example of the structure of the two-dimensional photonic crystal optical reflector using interference between point defects.

(4) Embodiment of Two-Dimensional Photonic Crystal Optical Reflector Using Interference between Point Defects FIG. 7 schematically shows an example of the structure of the two-dimensional photonic crystal optical reflector using interference between point defects. Comparing this figure with FIG. 5 clearly shows that this optical reflector is structurally the same as the waveguide optical resonator shown in FIG. 5. As explained previously, the point-like defect pair internally satisfies the resonance condition, while it satisfies the reflection condition for the light coming from the outside to this point. Therefore, as indicated by the thick arrow in FIG. 7, the light having a wavelength that satisfies $\lambda=2L/m$ is reflected by the point-like defect pair and cannot travel further.

Figure 6:
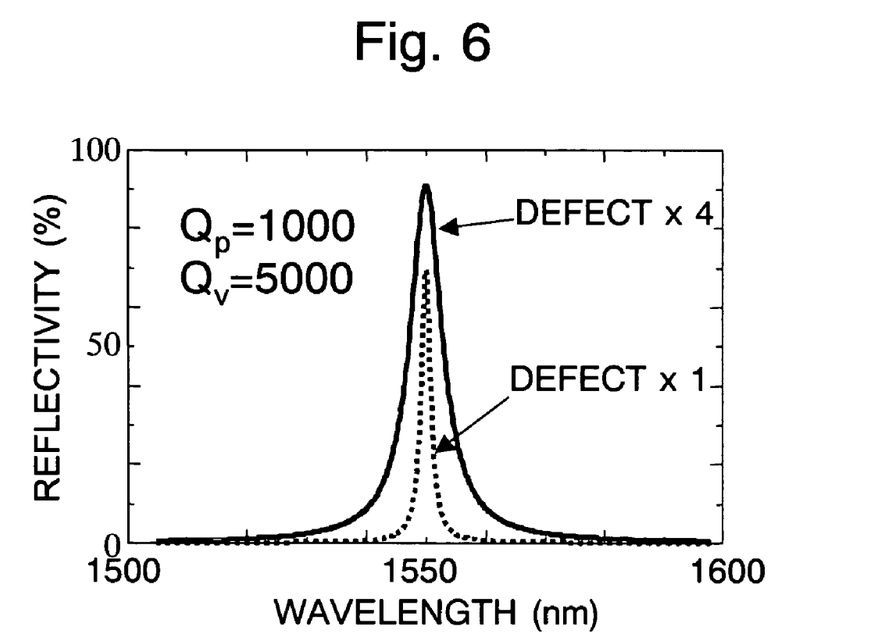
FIG. 6 shows the reflectivity of a two-dimensional photonic crystal optical reflector using interference between point defects.
Figure 8A:
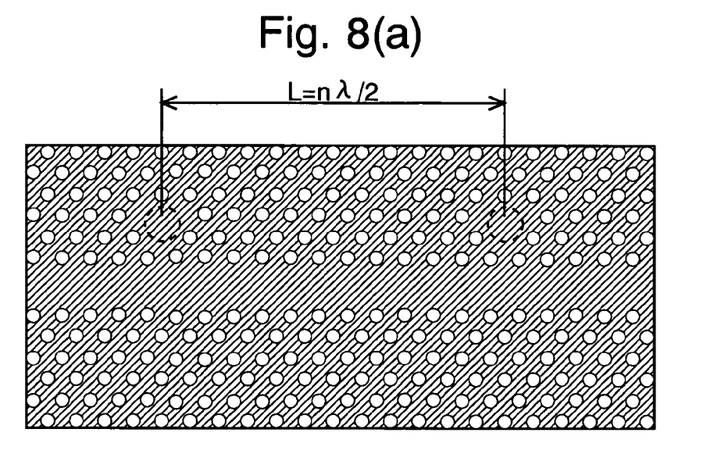
Figure 8B:
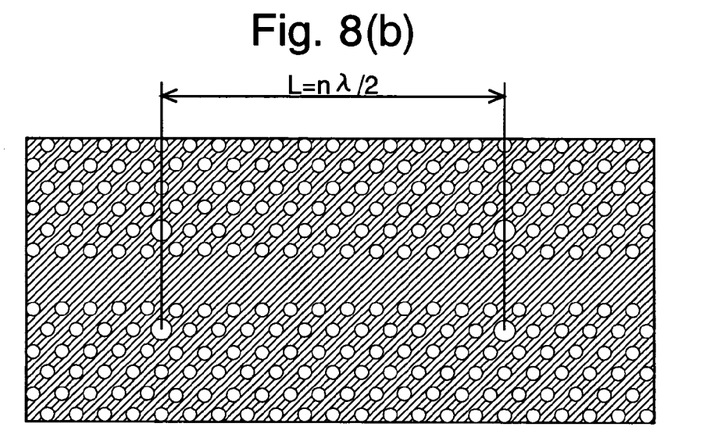
Figure 8C:
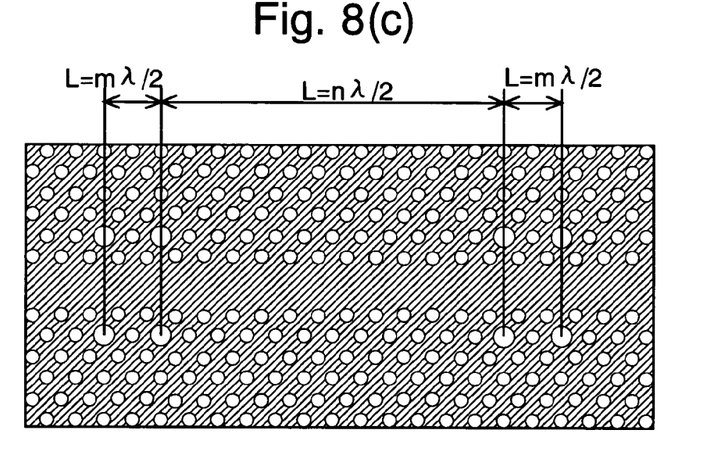

FIGS. 8(a), 8(b) and 8(c) show other examples of the structure of the above-described waveguide optical resonator and optical reflector. In the example shown in FIG. 8(a), donor type cluster defects are used as the point-like defects. In the example shown in FIG. 8(b), point-like defect pairs are located on both sides of the waveguide. In the example shown in FIG. 8(c), point-like defect pairs are located on both sides of the waveguide, and each point-like defect pair also consists of a point-like defect pair. For this structure, the reflectivity has been calculated as shown in FIG. 6. This shows that the structure having four defects as shown in FIG. 8(c) provides better reflectivity than the structure shown in FIG. 5 where each point-like defect consists of a single point defect.

What is claimed is:

1. A two-dimensional photonic crystal optical resonator using interference between point defects, characterized in that it comprises:
   a) a slab-shaped body;
   b) a plurality of modified refractive index areas having a refractive index different from that of the body, which are periodically arranged in the body;
   c) one waveguide formed in the body by making defects of the modified refractive index areas linearly; and
   d) a point-like defect pair consisting of two point-like defects of the same type, which are located in proximity to the waveguide and spaced apart from each other in the longitudinal direction of the waveguide by a distance $(2n-1)/4$ times as long as the resonance wavelength of interest, where n is a positive integer,
   and in that it extracts light from the waveguide in the body at one of the two point-like defects that is first encountered by the light propagating through the waveguide.

2. The two-dimensional photonic crystal optical resonator using interference between point defects according to claim 1, characterized in that each defect of the point-like defect pair is a cluster defect composed of two or more defects adjacent to each other.

3. The two-dimensional photonic crystal optical resonator using interference between point defects according to claim 1, characterized in that each defect constituting the point-like defect pair is located at the same distance from the waveguide.

4. The two-dimensional photonic crystal optical resonator using interference between point defects according to claim 1, characterized in that the modified refractive index areas consist of holes bored in the body.

5. A two-dimensional photonic crystal optical resonator using interference between point defects, characterized in that it comprises:
   a) a slab-shaped body;
   b) a plurality of modified refractive index areas having a refractive index different from that of the body, which are periodically arranged in the body;
   c) a waveguide formed in the body by making defects of the modified refractive index areas linearly; and
   d) a point-like defect pair consisting of two point-like defects of the same type, which are located in proximity to the waveguide and spaced apart from each other in the longitudinal direction of the waveguide by a distance $n/2$ times as long as a resonance wavelength of interest, where n is a positive integer.

6. The two-dimensional photonic crystal optical resonator using interference between point defects according to claim 5, characterized in that each defect of the point like-defect pair is a cluster defect composed of two or more defects adjacent to each other.

7. The two-dimensional photonic crystal optical resonator using interference between point defects according to claim 5, characterized in that each defect constituting the point like-defect pair is an optical reflector consisting of two point defects of the same type, which are spaced apart from each other in the longitudinal direction of the waveguide by a distance $m/2$ times as long as the resonance wavelength of interest, where m is a positive integer and n>m.

8. The two-dimensional photonic crystal optical resonator using interference between point defects according to claim 7, characterized in that another optical reflector is located in opposition to the aforementioned optical reflector across the waveguide and in a width-direction of the waveguide.

9. The two-dimensional photonic crystal optical resonator using interference between point defects according to claim 7, characterized in that the point-like defect constituting the optical reflector is a cluster defect.

10. The two-dimensional photonic crystal optical resonator using interference between point defects according to claim 5, characterized in that the waveguide contains a laser medium.

11. The two-dimensional photonic crystal optical resonator using interference between point defects according to claim 5, characterized in that each defect constituting the point-like defect pair is located at the same distance from the waveguide.

12. The two-dimensional photonic crystal optical resonator using interference between point defects according to claim 5, characterized in that the modified refractive index areas consist of holes bored in the body.

13. A two-dimensional photonic crystal optical reflector using interference between point defects, characterized in that it comprises:
   a) a slab-shaped body;
   b) a plurality of modified refractive index areas having a refractive index different from that of the body, which are periodically arranged in the body;
   c) a waveguide formed in the body by making defects of the modified refractive index areas linearly; and
   d) a point-like defect pair consisting of two point-like defects of the same type, which are located in proximity to the waveguide and spaced apart from each other in the longitudinal direction of the waveguide by a distance $m/2$ times as long as a resonance wavelength of interest, where m is a positive integer.

14. The two-dimensional photonic crystal optical reflector using interference between point defects according to claim 13, characterized in that it comprises another point-like defect pair of the same type located in opposition to the aforementioned point-like defect pair across the waveguide and in a width-direction of the waveguide.

15. The two-dimensional photonic crystal optical reflector using interference between point defects according to claim 13, characterized in that each defect constituting the point-like defect pair is located at the same distance from the waveguide.

16. The two-dimensional photonic crystal optical reflector using interference between point defects according to claim 13, characterized in that the modified refractive index areas consist of holes bored in the body.

17. The two-dimensional photonic crystal optical reflector using interference between point defects according to claim 13, characterized in that each defect of the point like-defect pair is a cluster defect composed of two or more defects adjacent to each other.

* * * * *